US012261175B2

(12) United States Patent
Lin et al.

(10) Patent No.: US 12,261,175 B2
(45) Date of Patent: Mar. 25, 2025

(54) METHOD FOR FORMING INTEGRATED CIRCUIT

(71) Applicant: TAIWAN SEMICONDUCTOR MANUFACTURING COMPANY LTD., Hsinchu (TW)

(72) Inventors: Meng-Han Lin, Hsinchu (TW); Te-An Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/155,751

(22) Filed: Jan. 18, 2023

(65) Prior Publication Data
US 2023/0290787 A1    Sep. 14, 2023

Related U.S. Application Data

(62) Division of application No. 17/368,725, filed on Jul. 6, 2021, now Pat. No. 11,569,267, which is a division
(Continued)

(51) Int. Cl.
*H01L 27/12* (2006.01)
*H01L 21/762* (2006.01)
(Continued)

(52) U.S. Cl.
CPC .... *H01L 27/1203* (2013.01); *H01L 21/76283* (2013.01); *H01L 21/84* (2013.01); *H01L 29/0649* (2013.01); *H01L 29/66545* (2013.01)

(58) Field of Classification Search
CPC .......... H01L 27/1203; H01L 21/76283; H01L 21/84; H01L 29/0648; H01L 29/0649; H01L 21/76229
(Continued)

(56) References Cited

U.S. PATENT DOCUMENTS

| 2013/0234244 A1 | 9/2013 | Liu et al. |
| 2014/0061811 A1 | 3/2014 | Chien et al. |

(Continued)

FOREIGN PATENT DOCUMENTS

| CN | 1771589 A | 5/2006 |
| KR | 20010088287 A | 9/2001 |

OTHER PUBLICATIONS

U.S. Pat. No. 6,764,884 B1 is the US counterpart of CN 1771589 A.
(Continued)

*Primary Examiner* — Karen Kusumakar
(74) *Attorney, Agent, or Firm* — WPAT LAW; Anthony King

(57) ABSTRACT

A method for forming an integrated circuit includes following operations. A substrate is received. The substrate includes a first region, a second region and an isolation structure. The isolation structure has a first top surface, a second top surface lower than the first top surface, and a boundary between the first top surface and the second top surface. A first device is formed in the first region, a second device is formed in the second region, and a dummy structure is formed on a portion of the first top surface, a top of the second top surface and the boundary. A dielectric structures is formed over the substrate. Top surfaces of the dielectric structure, the first device, the second device and the dummy structure are aligned with each other. A first metal gate is formed in the first device, and a second metal gate is formed in the second device.

20 Claims, 16 Drawing Sheets

Related U.S. Application Data of application No. 16/732,230, filed on Dec. 31, 2019, now Pat. No. 11,069,714.

(51) Int. Cl.
*H01L 21/84* (2006.01)
*H01L 29/06* (2006.01)
*H01L 29/66* (2006.01)

(58) Field of Classification Search
USPC .................. 438/207, 216; 257/374, 466, 347
See application file for complete search history.

(56) References Cited

U.S. PATENT DOCUMENTS

| | | | |
|---|---|---|---|
| 2015/0129969 A1 | 5/2015 | Chuang et al. | |
| 2019/0148389 A1* | 5/2019 | Lin | H10B 41/43 257/508 |
| 2019/0326278 A1* | 10/2019 | Lee | H01L 21/76832 |
| 2023/0290787 A1* | 9/2023 | Lin et al. | H01L 27/1203 |

OTHER PUBLICATIONS

U.S. Pat. No. 6,613,621 B2 is the US counterpart of KR 20010088287 A.

\* cited by examiner

10

101 — Receiving a substrate having a first region, a second region and an isolation structure separating the first region from the second region 102 — Removing a portion of the substrate such that the second region is recessed and removing a portion of isolation structure such that the isolation structure obtains a first top surface, a second top surface lower than the first top surface and a boundary between the first top surface and the second top surface 103 — Forming a high-k gate dielectric layer over the substrate 104 — Forming a semiconductor layer on the high-k gate dielectric layer 105 — Patterning the high-k gate dielectric layer and the semiconductor layer to form a first sacrificial gate in the first region, a second sacrificial gate in the second region and a dummy structure on the isolation structure 106 — Forming a first device in the first region, a second device in the second region and a dummy structure over a portion of the first top surface, a portion of the second top surface and the boundary between the first top surface and the second top surface 107 — Forming a dielectric structure over the substrate to cover the first device, the second device and dummy structure 108 — Removing a portion of the dielectric structure, a portion of the first device, a portion of the second device and a portion of the dummy structure such that a top surface of the first device, a top surface of the second device and a top surface of the dummy structure are aligned with each other 109 — Removing the first sacrificial gate and the second sacrificial gate to form a first gate trench and a second gate trench 110 — Forming a first metal gate in the first gate trench and a second metal gate in the second gate trench

FIG. 1

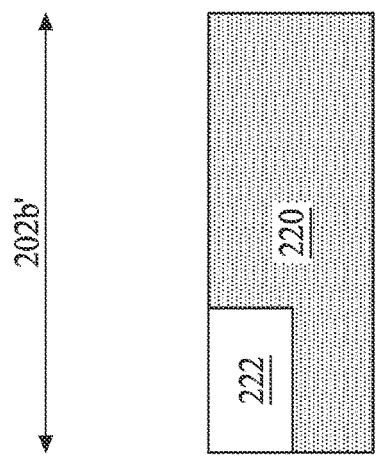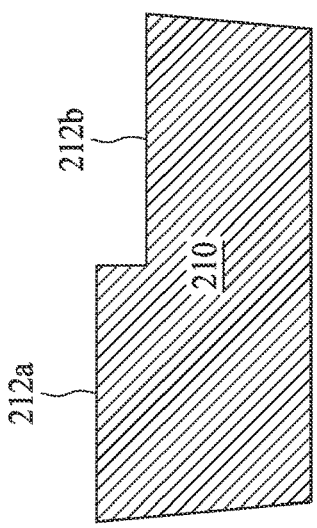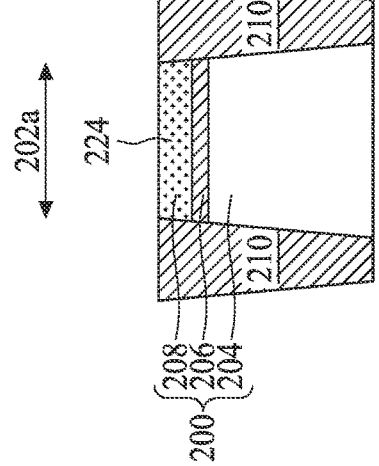
FIG. 2D

METHOD FOR FORMING INTEGRATED CIRCUIT

PRIORITY DATA

This patent is a divisional application of U.S. patent application Ser. No. 17/368,725 filed Jul. 6, 2021, entitled of "METHOD FOR FORMING INTEGRATED CIRCUIT", which is a divisional application of U.S. patent application Ser. No. 16/732,230 filed Dec. 31, 2019, entitled of "BOUNDARY SCHEME FOR SEMICONDUCTOR INTEGRATED CIRCUIT AND METHOD FOR FORMING AN INTEGRATED CIRCUIT," the entire disclosure of which is hereby incorporated by reference.

BACKGROUND

In the semiconductor art, it is desirable to improve transistor performance as devices become smaller due to ongoing reductions in device scale. Further, it is desirable to manufacture integrated circuit ("IC") semiconductor devices that incorporate transistors for low, high and sometimes medium voltage range applications in a single integrated circuit. For example, transistors for logic functions, which operate at relatively low voltages, and transistors for high power applications, which operate at relatively high voltages, may be designed and fabricated on the same IC.

The transistors operating in two different voltage ranges are located on different regions of the IC, and use of shallow trench isolation (STI) is a typical approach that allows the regions for various types of transistors to be integrated onto the IC by creating electrically isolated regions within a single substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flowchart representing a method for forming an integrated circuit according to aspects of the present disclosure.

FIGS. 2A to 2M are cross-sectional views illustrating stages of a method for forming an integrated circuit according to aspects of the present disclosure.

DETAILED DESCRIPTION

Figure 2A:
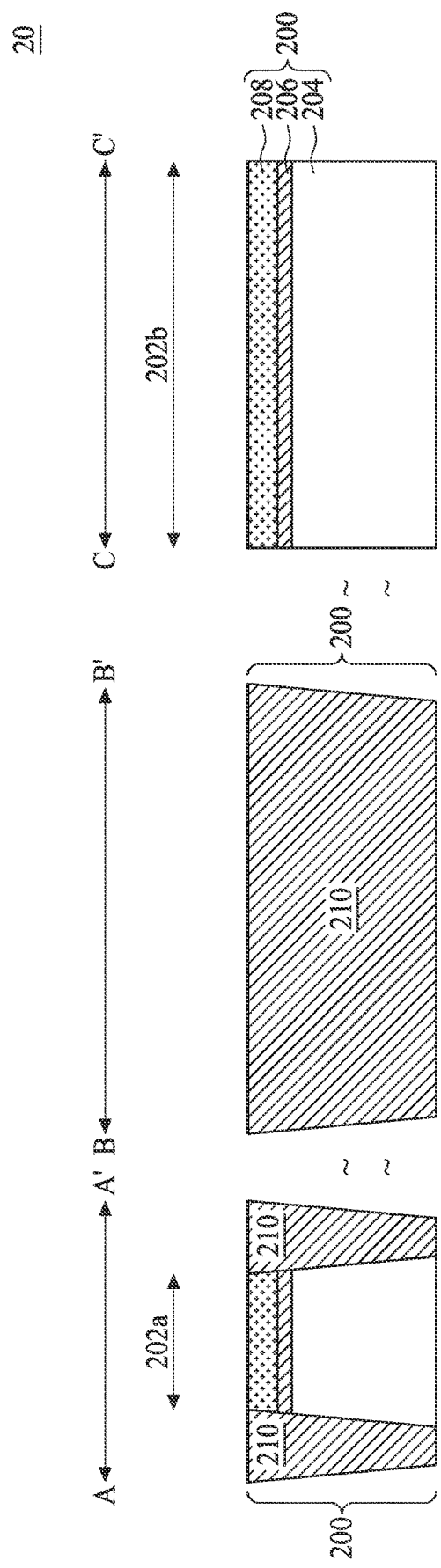

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Silicon-on-insulator (SOI) substrate has been widely used in semiconductor manufacturing operations. Due to the advantages provided by SOI, such as low parasitic capacitance, lower noise, less short channel effect and better swing performance, high-voltage (HV) devices can be embedded with SOI technology for integration with HV devices and low-voltage (LV) devices.

Further, high-k metal gate (HKMG) technology is expected to play an important role in the next generation of CMOS devices. This technology incorporates a high-k dielectric, which reduces leakage and improves the dielectric constant. To help with fermi-level pinning and to allow the gate to be adjusted to low threshold voltages, a metal gate is used instead of a polysilicon gate. By combining the metal gate and high-k dielectric, HKMG technology reduces gate leakage, thereby increasing the transistor capacitance and allowing chips to function with reduced power needs. Thus, integrating HV and LV devices with HKMG is a technology that enables conventional scaling of the transistor as well as reduction in required stand-by power due to a reduction in gate leakage.

However, research has found that when integrating the HV device with the HKMG technology can cause, high-k dielectric residue at a boundary between the LV device and the HV device. The high-k dielectric residue may cause a contamination during the subsequent manufacturing operations.

The present disclosure therefore provides a boundary scheme for the integration of HV devices and LV devices with HKMG technology. In some embodiments, the present disclosure therefore provides a boundary scheme for the integration of HV devices and LV devices with high-k first and metal-gate last technology. In some embodiments, a dummy structure such as a dummy polysilicon structure can be disposed on the boundary between a region accommodating the HV devices and a region accommodating the LV devices. The dummy structure is provided to entirely seal the high-k dielectric residue that is generated during manufacturing operations, and thus the high-k residue contamination can be mitigated.

In some embodiments, the high voltage (HV) devices used herein are referred to as devices, such as integrated circuit die input/output (I/O) devices, that generally have operating voltages greater than those of logic devices. For example, HV devices can have operating voltages greater than approximately 2.5 volts, while the logic devices can have operating voltages less than approximately 1.2 volts. In some embodiments, logic devices that have relatively low operating voltages are referred to as LV devices. However, operating voltages can vary for different applications, thus they are not limited herein.

FIG. 1 is a flowchart representing a method for forming an integrated circuit 10 according to aspects of the present disclosure. The method 10 includes a number of operations (101, 102, 103, 104, 105, 106, 107, 108, 109 and 110). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

FIGS. 2A to 2M are cross-sectional views illustrating stages of a method for forming an integrated circuit according to aspects of the present disclosure. At operation 101, a substrate 200 having a first region 202a, a second region 202b and an isolation structure 210 separating the first region 202a from the second region 202b is received or provided. In some embodiments, the first region 202a can be used to accommodate LV devices such as logic devices, while the second region 202b can be used to accommodate HV devices such as I/O devices, but the disclosure is not limited thereto. In some embodiments, the isolation structure 210 is formed to surround the first region 202a and the second region 202b such that at least a portion of the isolation structure 210 is disposed between the first region 202a and the second region 202b, as shown in FIG. 2A. Accordingly, the first region 202a and the second region 202b are electrically separated from each other by the isolation structure 210. In some embodiments, the isolation structure 210 can be a shallow trench isolation (STI), but the disclosure is not limited thereto.

In some embodiments, the substrate 200 can be a silicon-on-insulator (SOI) substrate. As shown in FIG. 2A, the substrate 200 can include a semiconductor bulk 204, a semiconductor layer 208 and a dielectric layer 206 disposed between the semiconductor bulk 204 and the semiconductor layer 208. In some embodiments, the semiconductor layer 208 can include a semiconductor material such as silicon, germanium, silicon germanium, or combinations thereof, but the disclosure is not limited thereto. In some embodiments, the dielectric layer 206 may be, for example, a buried oxide (BOX) layer or a silicon oxide layer, but the disclosure is not limited thereto. In some embodiments, the semiconductor bulk 204 can include silicon, but the disclosure is not limited thereto. In other embodiments, substrates that may be used include multi-layered substrates, gradient substrates, or hybrid orientation substrates. In some embodiments, a sum of a thickness of the semiconductor layer 208 and a thickness of the dielectric layer 206 can be between approximately 200 angstroms and approximately 50 angstroms, but the disclosure is not limited thereto. In some embodiments, devices formed over the SOI substrate can be referred to as SOI devices. In addition to the ability to retain low intra-well and inter-well leakage currents, the dielectric layer 206 also permits smaller distance for isolation spacing, thus permitting increased packing density. Additional advantages of SOI devices with respect to bulk devices include: reduced soft error sensitivity, improved turn-on characteristic, reduced leakage current, and improved reliability by eliminating junction spiking.

Figure 2B:
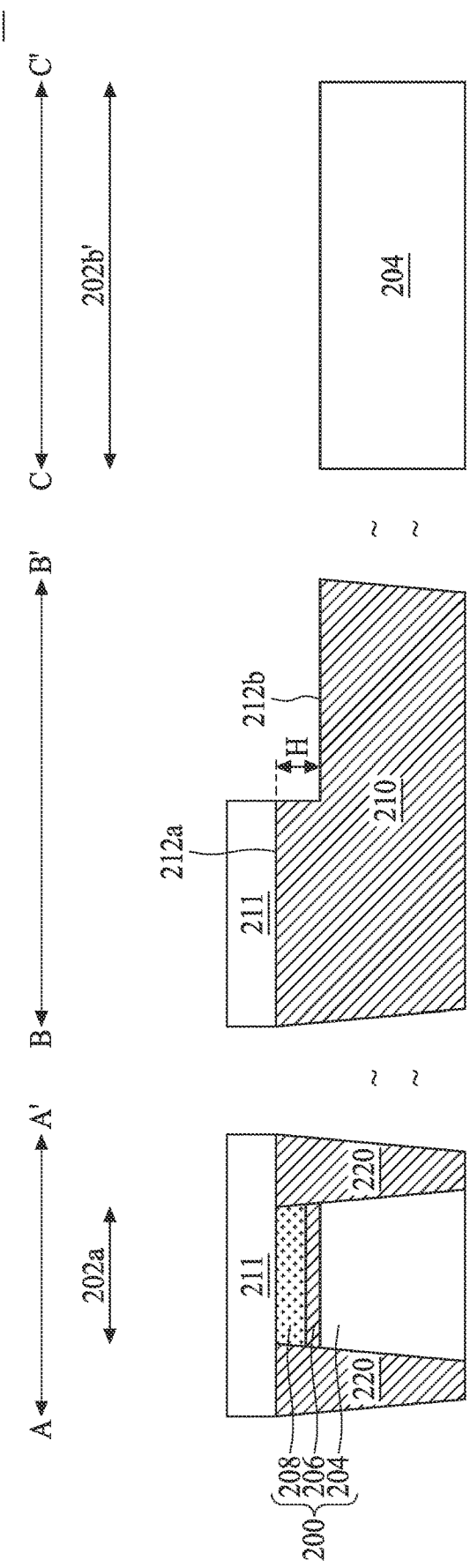

At operation 102, a portion of the substrate 200 is removed such that the second region 202b is recessed, and a portion of the isolation structure 210 is removed such that the isolation structure 210 obtains a first top surface 212a, a second top surface 212b lower than the first top surface 212a, and a boundary between the first top surface 212a and the second top surface 212b. As shown in FIG. 2B, in some embodiments, a patterned mask 211 such as a patterned photoresist can be formed over the substrate 200. A suitable etching operation can be performed to remove a portion of the substrate 200 in the second region 202b and a portion of the isolation structure 210 exposed through the patterned mask 211. In some embodiments, a portion of the semiconductor layer 208 and a portion of the dielectric layer 206 in the second region 202b are removed, such that the semiconductor bulk 204 is exposed. In other embodiments, a portion of the semiconductor layer 208, a portion of the dielectric layer 206 and a portion of the semiconductor bulk 204 in the second region 202b are removed. Consequently, a recessed second region 202b' is obtained as shown in FIG. 2B.

Further, the portion of the isolation structure 210 exposed through the patterned mask 211 is removed, wherein a thickness of the removed portion of the isolation structure 210 is similar to a thickness of the removed portion of the substrate 200. Consequently, the isolation structure 210 obtains a first top surface 212a, a second top surface 212b and a boundary between the first top surface 212a and the second top surface 212b. The second top surface 212b is lower than the first top surface 212a. Further, the first top surface 212a of the isolation structure 210 and a top surface of the substrate 200 in the first region 202a are aligned with each other, or are at the same level, while the second top surface 212b of the isolation structure 210 and a top surface of the substrate 200 in the second region 202b' are aligned with each other, or are at the same level. As shown in FIG. 2B, a step height H is formed at the boundary between the first top surface 212a and the second top surface 212b of the isolation structure 210. In some embodiments, the step height H can be equal to or greater than the thickness of the removed portion of the substrate 200. For example, when the etching operation is performed to remove the portion of the semiconductor layer 208 and the portion of the dielectric layer 206 in the second region 202b', the step height H is equal to or greater than the sum of the thickness of the semiconductor layer 208 and the thickness of the dielectric layer 206, such as between approximately 200 angstroms and approximately 500 angstroms, but the disclosure is not limited thereto. The patterned mask 211 can then be removed.

Figure 2C:
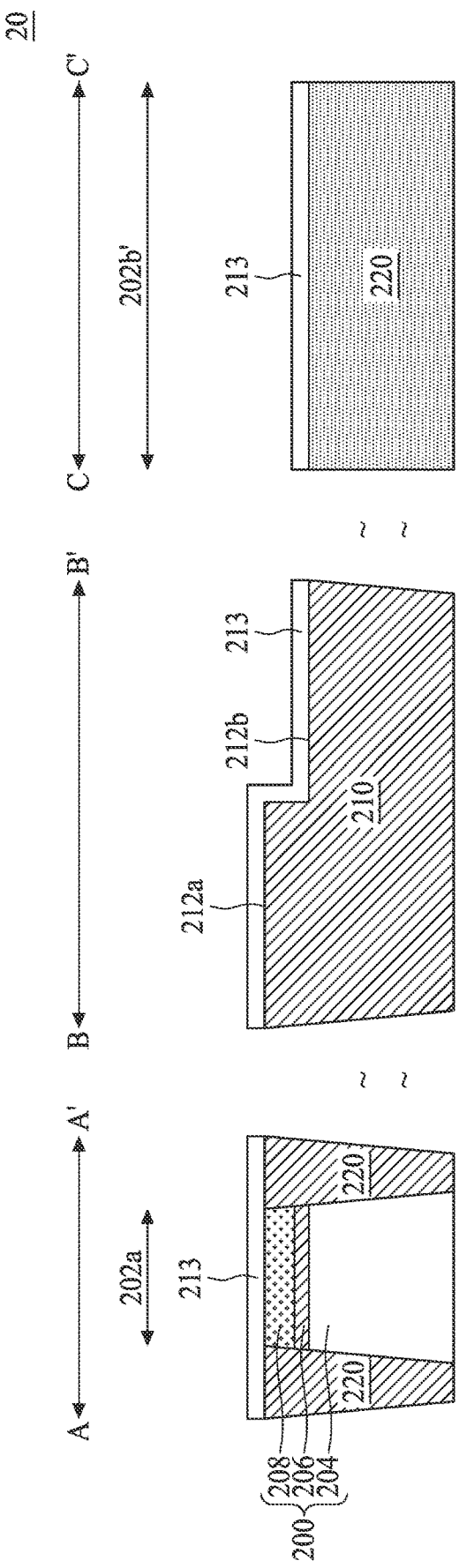

As shown in FIG. 2C, in some embodiments, a sacrificial insulating layer 213 is formed to completely cover the substrate 200. After the forming of the sacrificial insulating layer 213, a well region 220 can be formed in the substrate 200 in the second region 202b'. In some embodiments, an implantation and an anneal can be performed on the semiconductor bulk 204 in the second region 202b'. Consequently, the well region 220 is obtained. In some embodiments, the sacrificial insulating layer 213 helps to protect the substrate 200 in the first region 202a and the isolation structure 210 and to mitigate an outgassing issue during the forming of the well region 220. In some embodiments using an n-type HV device, the well region 220 can have n-type dopants. In some embodiments, the well region 220 can be referred to as a drift region. In some embodiments, the drift region is between a device channel (e.g., under a gate structure to be formed) and a drain region to be formed. The drift region is configured to provide a high device breakdown voltage and protection from hot-carrier injection (HCI).

Referring to FIG. 2D, after the forming of the well region 220, a body region 222 is formed. The body region 222 can be disposed in the well region 220. In embodiments using an n-type HV device, the body region 222 can have p-type dopants that are opposite to that of the well region 220. In some embodiments, a body contact region (not shown) can be formed in the body region 222. The body contact region can have the same type of dopants as the body region 222. The body contact region can provide an electrical connection for the body region 222. It should be understood that the locations of the well region 220 and the body region 222 (and the body contact region) shown in FIG. 2D are merely exemplary, and one having skill in the art can modify them to achieve a desired HV device.

Still referring to FIG. 2D, after the forming of the body region 222, a well region 224 is formed in the substrate 200 in the first region 202a. In some embodiments, the well region 224 is formed in the semiconductor layer 208 in the first region 202a. In other embodiments, the well region 224 is formed in both of the semiconductor layer 208 and the semiconductor bulk 204. Additionally, depending on the type of the LV device to be formed, the well region 224 can include n-type or p-type dopants. In some embodiments, a well implantation is performed, and the sacrificial insulating layer 213 is subsequently removed. Before the removing of the sacrificial insulating layer 213, an anneal is performed. Consequently, the well region 224 for the LV device is obtained.

Figure 2E:
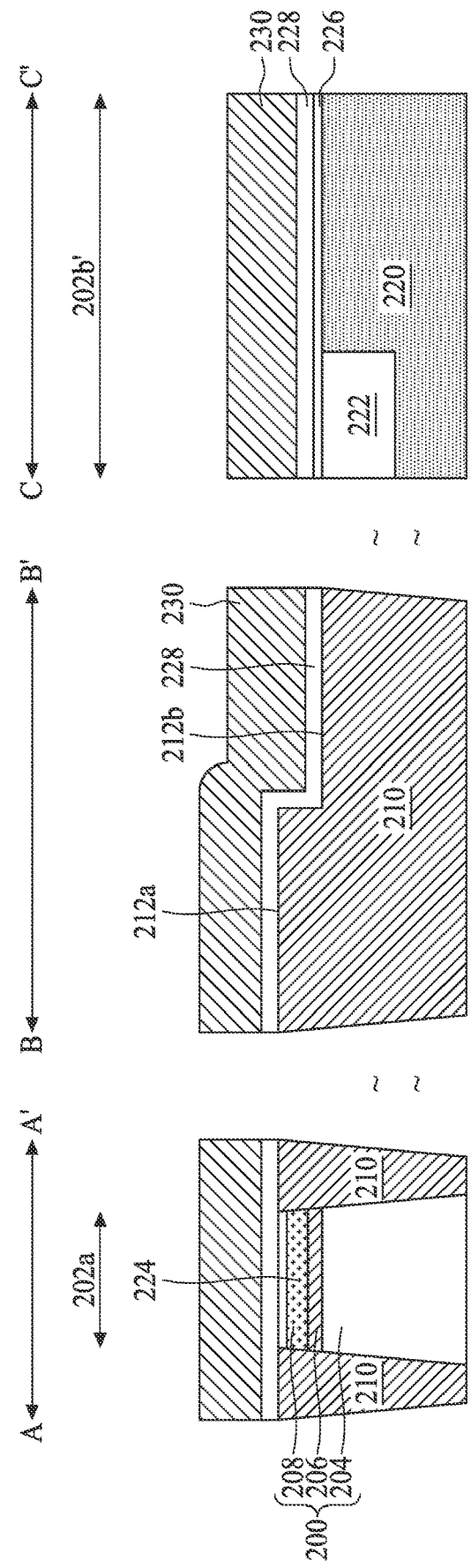

At operation 103, a high-k gate dielectric layer 228 is formed over the substrate 200. In some embodiments, prior to the forming of the high-k gate dielectric layer 228, an interfacial layer (IL) 226 can be formed on the substrate 200. One example of the IL 226 is a thin silicon oxide layer. In some embodiments, the thin silicon oxide layer can be formed by thermal oxidation. In other embodiments, the thin silicon oxide layer can be formed by atomic layer deposition (ALD). When the thermal oxidation is utilized to form the IL 226, the IL 226 is formed only on a top surface of the semiconductor material. Therefore, the IL 226 is formed on the semiconductor layer 208 in the first region 202a and on the semiconductor bulk 204 in the second region 202b', while the isolation structure 210 is free of the IL 226, as shown in FIG. 2E. In other words, the IL 226 is formed on the well region 224 in the first region 202a and on the drift region 220 and the body region 222 in the second region 202b'. It has been observed that the IL 226 may provide a remedy for some high-k dielectric gate stack integration issues, such as carrier trapping by HK and carrier mobility reduction. The IL 226 may also be important as a diffusion barrier to prevent undesirable interface reactions between the HK dielectric material and the substrate 200.

Still referring to FIG. 2E, the high-k gate dielectric layer 228 can be formed on the TL 226 by ALD, chemical vapor deposition (CVD), metal organic CVD (MOCVD), physical vapor deposition (PVD), thermal oxidation, combinations thereof, or other suitable techniques. In some embodiments, the high-k gate dielectric layer 228 may include a binary or ternary high-k film such as $HfO_X$. In some embodiments, the high-k gate dielectric layer 228 may include high-k material such as LaO, AlO, ZrO, TiO, $Ta_2O_5$, $U_2O_3$, $SiTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

At operation 104, a semiconductor layer 230 is formed on the high-k gate dielectric layer 228. In some embodiments, the semiconductor layer 230 can be a polysilicon layer disposed over the high-k gate dielectric layer 228 by deposition techniques. In other embodiments, the semiconductor layer 230 can be an amorphous silicon layer.

Figure 2F:
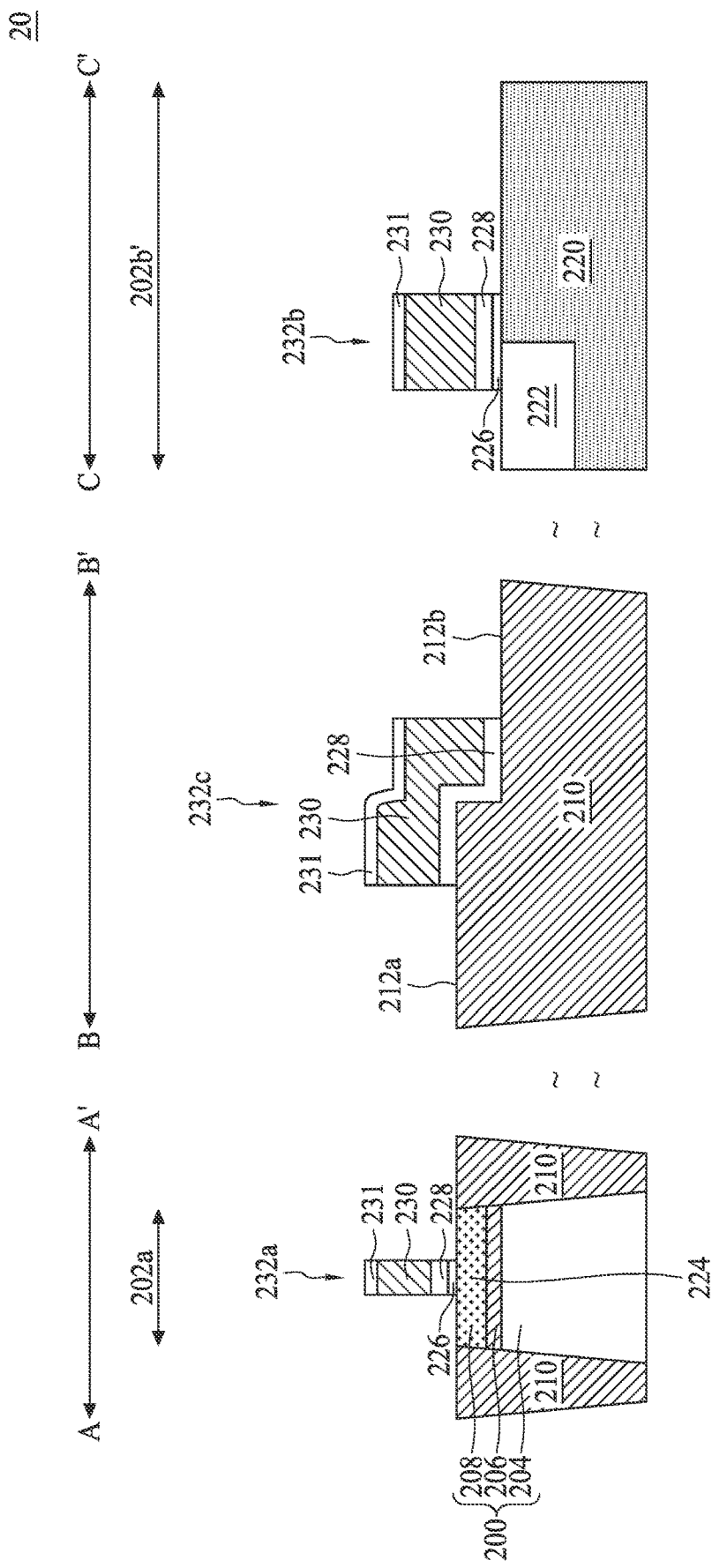

At operation 105, the semiconductor layer 230 and the high-k gate dielectric layer 228 are patterned to form a first sacrificial gate 232a in the first region 202a, a second sacrificial gate 232b in the second region 202b' and a dummy structure 232c on the isolation structure 210. As shown in FIG. 2F, a patterned hard mask 231 is formed over the semiconductor layer 230 to define locations and dimensions of the sacrificial gates, and an etching operation is performed to remove portions of the semiconductor layer 230 and the high-k gate dielectric layer 228. Consequently, the first sacrificial gate 232a is formed in the first region 202a, the second sacrificial gate 232b is formed in the second region 202b', and the dummy structure 232c is obtained. Further, the dummy structure 232c covers a portion of the first top surface 212a of the isolation structure 210, a portion of the second top surface 212b of the isolation structure 210, and a boundary between the first top surface 212a and the second top surface 212b, as shown in FIG. 2F. In some embodiments, thicknesses of the first sacrificial gate 232a, the second sacrificial gate 232b and the dummy structure 232c are similar.

In some comparative embodiments, the semiconductor layer 230 and the high-k gate dielectric layer 228 over the isolation structure 210 are removed. However, it is found the high-k material at the boundary between the first top surface 212a and the second top surface 212b may not be removed completely due to the step height H. Further, the high-k residue may cause contamination issue in the subsequent manufacturing operations. In some comparative embodiments, the high-k gate dielectric layer may be over-etched in order to remove the high-k material from the boundary. However, it is found that the high-k gate dielectric layer under the sacrificial gate suffers from damage and a reliability issue is raised. In contrast to those comparative embodiments, the dummy structure 232c is formed over the boundary of the first top surface 212a and the second top surface 212b, and therefore the high-k material (i.e., the high-k gate dielectric layer 228) is entirely covered by the semiconductor layer 230 of the dummy structure 232c.

Further, a width of the dummy structure 232c is greater than approximately 2 times a minimum critical dimension of the integrated circuit. It should be understood that the critical dimension (or the design rule limitation) defines the minimum width of a line or the minimum space between two lines permitted in the fabrication of a device. It should be noted that if the width of the dummy structure 230c is less than 2 times the minimum critical dimension of the integrated circuit, the high-k material may be left over the boundary between the first top surface 212a and the second top surface 212b when the dummy structure 232c is offset from the boundary due to process variation such as misalignment. Thus, the unwanted high-k residue issue occurs.

Figure 2G:
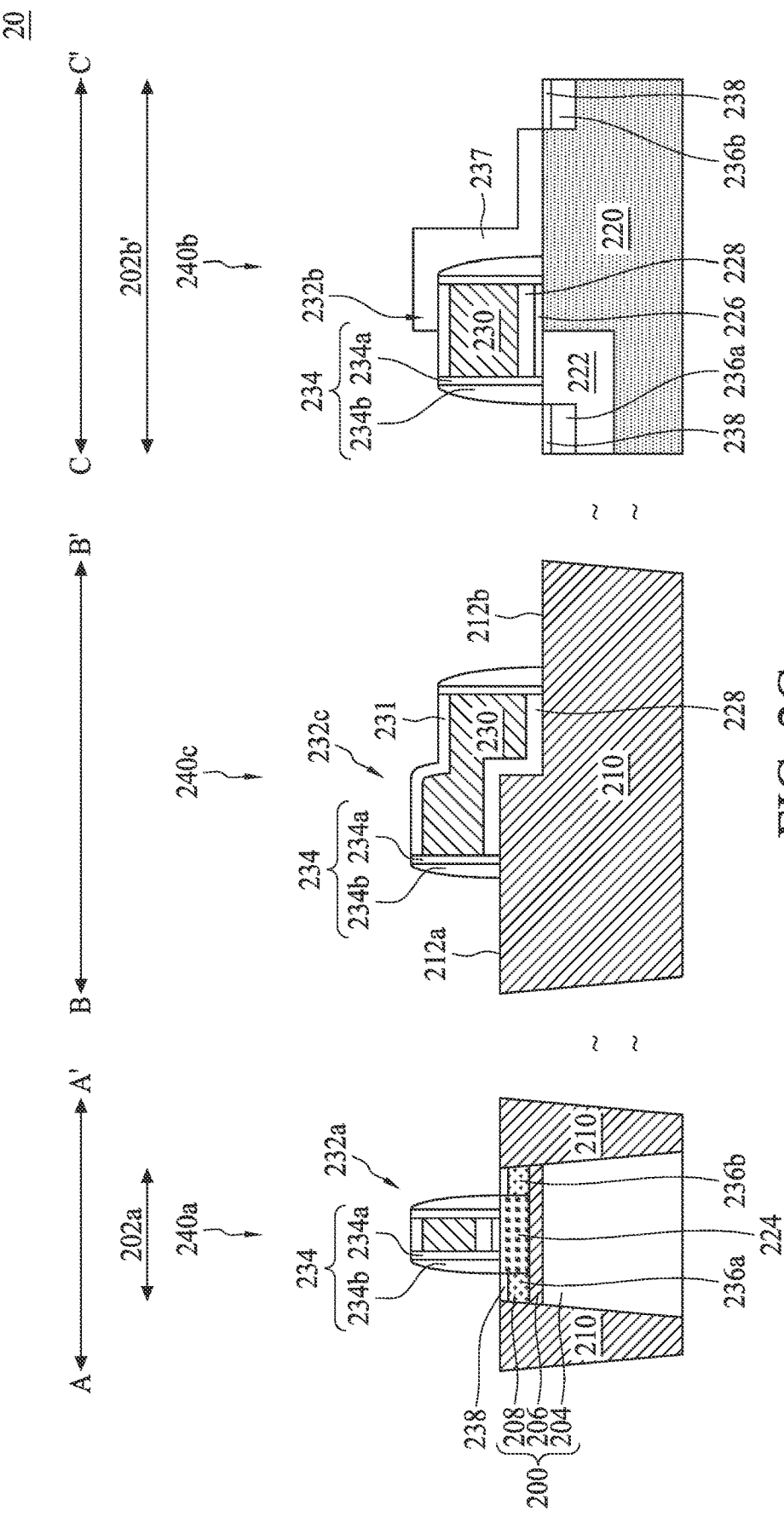

Referring to FIG. 2G, in some embodiments, a spacer 234 is formed over sidewalls of each of the first sacrificial gate 232a, the second sacrificial gate 232b and the dummy structure 232c. As shown in FIG. 2F, the spacer 234 covers sidewalls of the patterned hard masks 231, the semiconductor layers 230, the high-k gate dielectric layers 228 and the ILs 226 of the first sacrificial gate 232a and the second sacrificial gate 232b. The spacer 234 also covers sidewalls of the patterned hard mask 231, the semiconductor layer 230 and the high-k gate dielectric layer 228 of the dummy structure 232c. Therefore, the high-k gate dielectric layer 228 over the boundary between the first top surface 212a and the second top surface 212b can be entirely enclosed within the semiconductor layer 230 and the spacer 234 of the dummy structure 232c, as shown in FIG. 2G. In some embodiments, the spacers 234 can be a multiple layered structure. For example, the spacers 234 can be an oxide-nitride (ON) structure including a silicon nitride sealing layer 234a in contact with the ILs 226, the high-k gate dielectric layer 228, the semiconductor layers 230, and a silicon oxide layer 234b covering the silicon nitride sealing layer 234a, but the disclosure is not limited thereto.

Still referring to FIG. 2G, after the forming of the spacers 234, doped regions 236a and 236b are formed in the substrate 200. The doped regions 236a and 236b serve as a source region and a drain region, respectively. In some embodiments, in the first region 202a, the doped regions 236a and 236b are respectively formed in the substrate at two sides of the first sacrificial gate 232a. In some embodiments, in the second region 202b, the doped regions 236a and 236b are formed in the body region 222 and the drift region 220, respectively. For example, as shown in FIG. 2G, the doped region 236a is formed in the body region 222 while the doped region 236b is formed in the drift region 220 and separated from the dummy structure 232b by the drift region 220. Accordingly, at operation 106, a first device 240a is formed in the first region 202a, a second device 240b is formed in the second region 202b', and a dummy structure 240c is formed on the isolation structure 210. As shown in FIG. 2G, the dummy structure 240c covers a portion of the first top surface 212a, a portion of the second top surface 212b and the boundary between the first top surface 212a and the second top surface 212b. Thereafter, a protecting layer 237 such as a resist protective oxide (RPO) layer can be formed to cover a portion of the second device 240b, a portion of the doped region 236b and a portion of the drift region 220. Subsequently, a salicide layer 238 is formed over the exposed doped regions 236a and 236b, as shown in FIG. 2G. In some embodiments, after the forming of the salicide layer 238, the patterned hard masks 231 are removed.

Figure 2H:
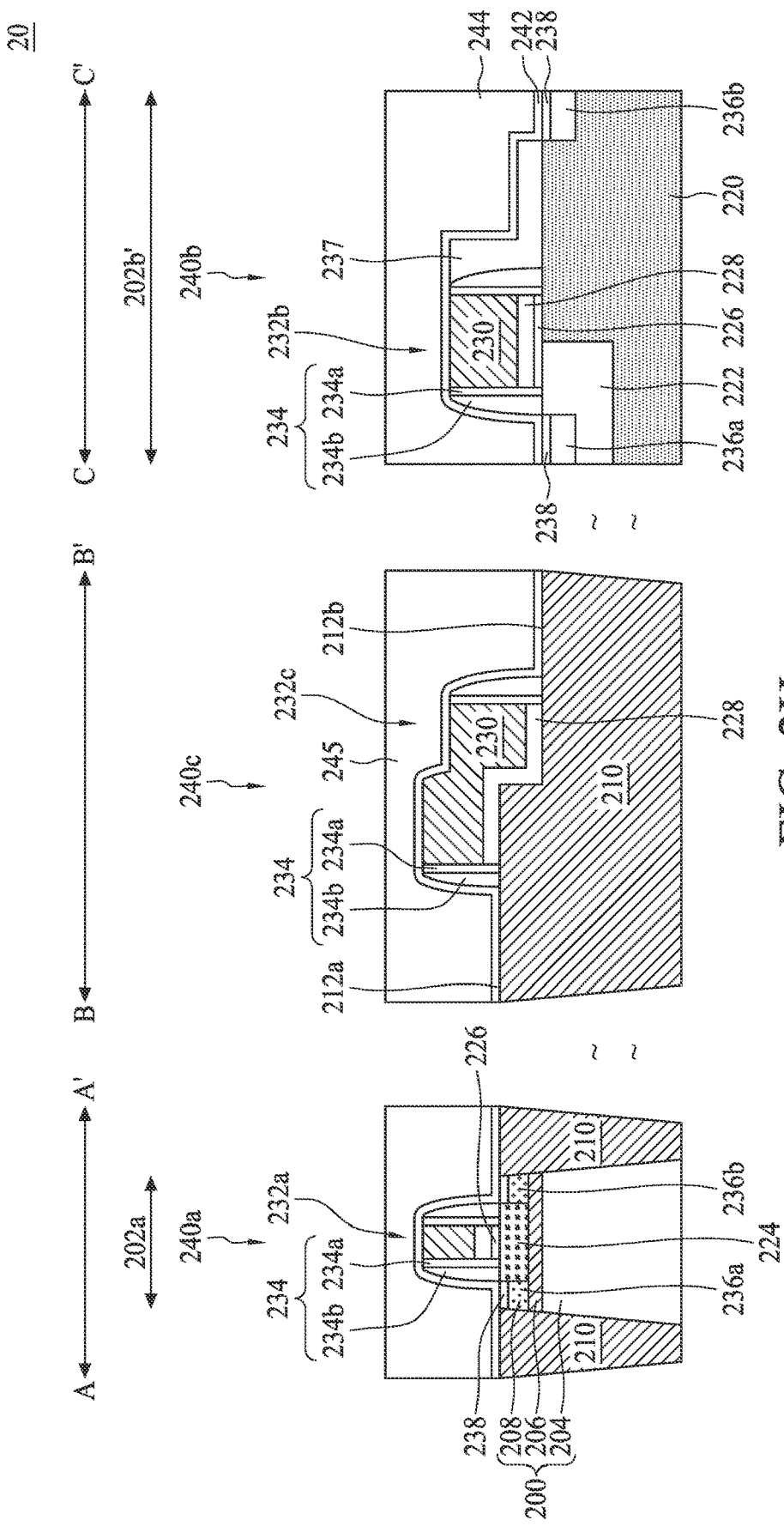

At operation 107, a dielectric structure is formed over the substrate 200 to cover the first device 240a, the second device 240b and the dummy structure 240c. In some embodiments, the dielectric structure can include a contact etch stop layer (CESL) 242 and an inter layer dielectric (ILD) 244, as shown in FIG. 2H. In some embodiments, the CESL 242 can include a material selected from silicon nitride, silicon carbide, or other dielectric materials. In some embodiments, the ILD 244 can be blanketly formed to a thickness sufficient to form a top surface higher than the top surfaces of first device 240a, the second device 240b and the dummy structure 240c. The ILD 244 may be formed of an oxide using, for example, flowable chemical vapor deposition (FCVD). The ILD 244 may also be a spin-on glass formed using spin-on coating. In some embodiments, the ILD 244 may include phospho-silicate glass (PSG), boro-silicate glass (BSG), boron-doped phospho-silicate glass (BPSG), tetraethyl orthosilicate (TEOS) oxide, TiN, SiOC, or other low-k non-porous dielectric materials.

Figure 2I:
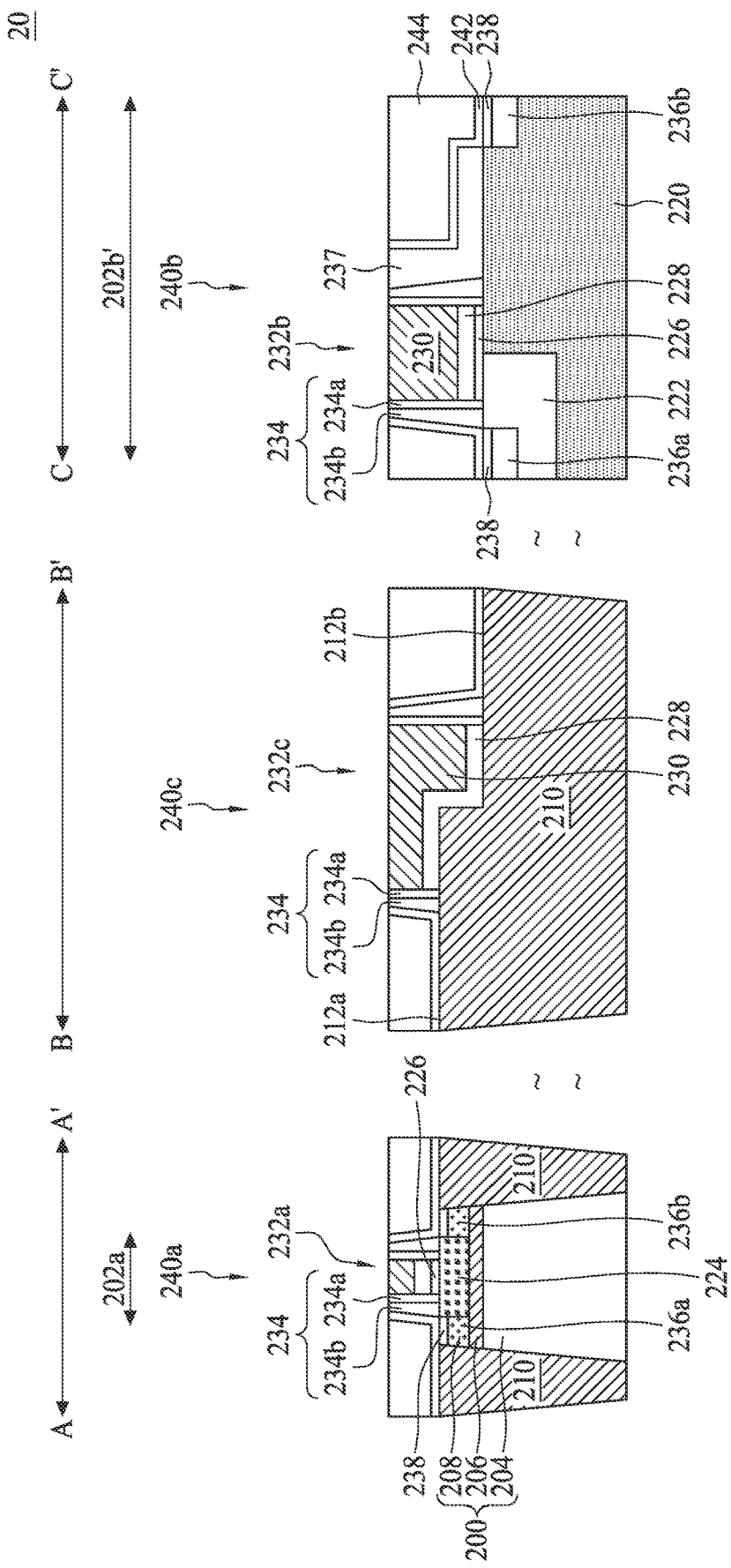

At operation 108, a portion of the dielectric structure, a portion of the first device 240a, a portion of the second device 240b and a portion of the dummy structure 240c are removed. As shown in FIG. 2I, in some embodiments, a planarization, such as a chemical mechanical polishing (CMP) operation, is performed to remove the portion of the dielectric structure, i.e., a portion of the ILD 244 and a portion of the CESL 242. The CMP is also performed to remove a portion of the first sacrificial gate 232a and a portion of the spacer 234 of the first device 240a, a portion of the second sacrificial gate 232b and a portion of the spacer 234 of the second device 240b, and a portion of the semiconductor layer 230 and a portion of the spacer 234 of the dummy structure 240c. Consequently, a top surface of the first device 240a, a top surface of the second device 240b and a top surface of the dummy structure 240c are aligned with each other, or at a same level, as shown in FIG. 2I.

Figure 2J:
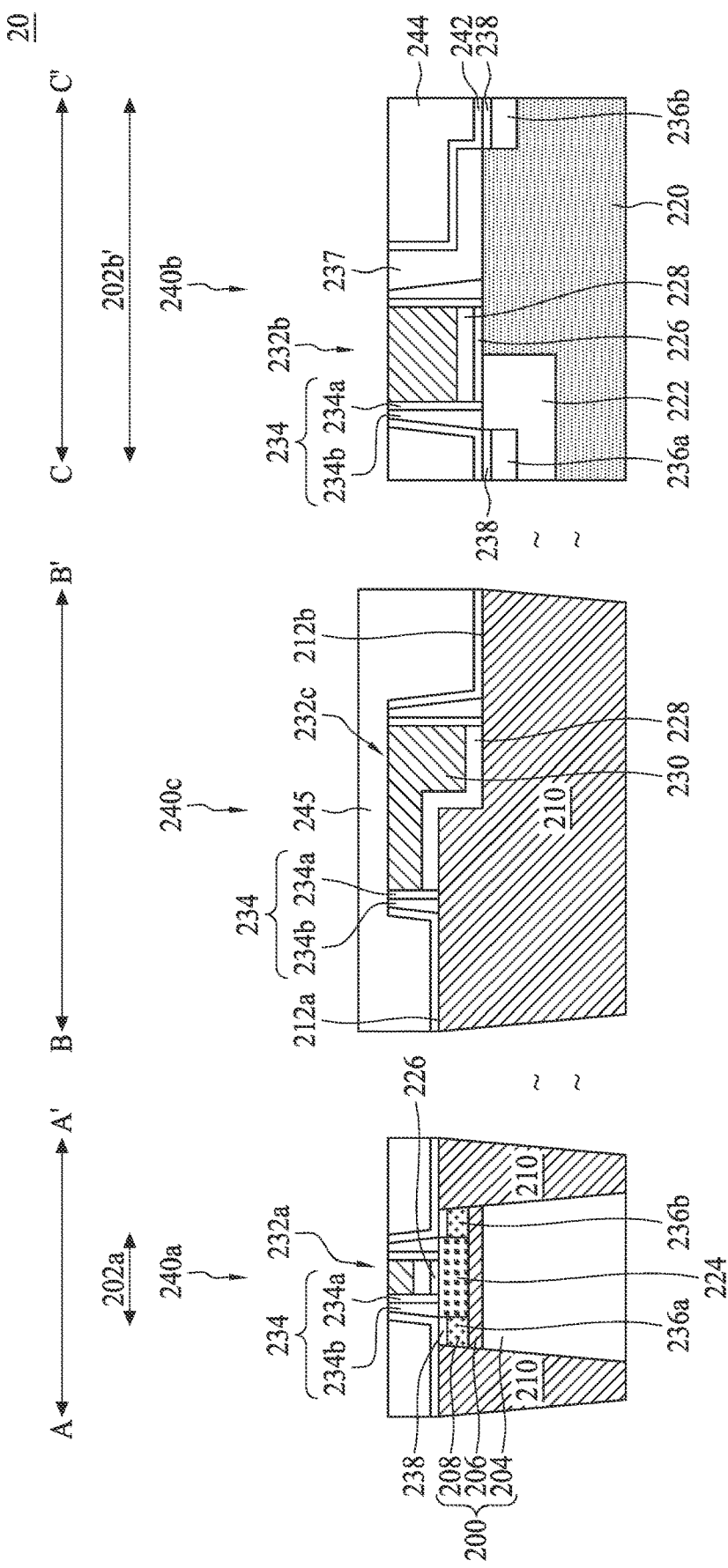

Referring to FIG. 2J, in some embodiments, a dielectric layer 245 is formed over the dummy structure 240c, but the first device 240a in the first region 202a and the second device 240b in the second region 202b' are exposed through the dielectric layer 245. The dielectric layer 245 servers as a protective layer for providing protection during the subsequent operations. In some embodiments, the dielectric layer 245 can include materials similar to the ILD 244, but the disclosure is not limited thereto. A thickness of the dielectric layer 245 should be great enough to endure the subsequent operation.

Figure 2K:
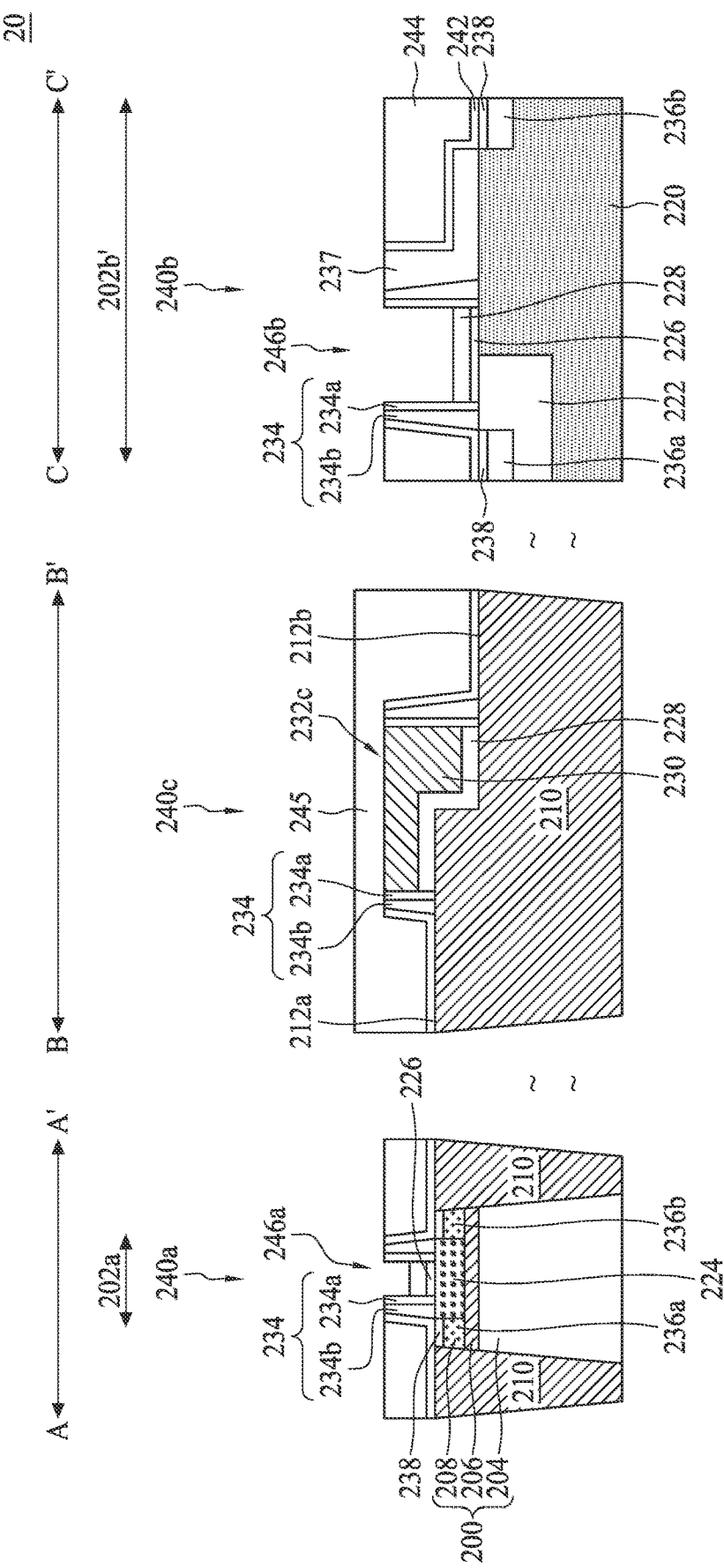

At operation 109, the first sacrificial gate 232a and the second sacrificial gate 232b are removed. As shown in FIG. 2K, the first sacrificial gate 232a (i.e., the semiconductor layer 230) is removed to form a first gate trench 246a in the first region 202a, and the high-k gate dielectric layer 228 is exposed through a bottom of the first gate trench 246a. The second sacrificial gate 232b (i.e., the semiconductor layer 230) is removed to form a second gate trench 246b in the second region 202b', and the high-k gate dielectric layer 228 is exposed through a bottom of the second gate trench 246b. In contrast to the portion of the semiconductor layer 230 in the first and second regions 202a and 202b', which are removed, the semiconductor layer 230 over the isolation structure 210 (i.e., over the portion of the first top surface 212a, the portion of the second top surface 212b and the boundary between the first top surface 212a and the second top surface 212b) is protected by the dielectric layer 245.

Figure 2L:
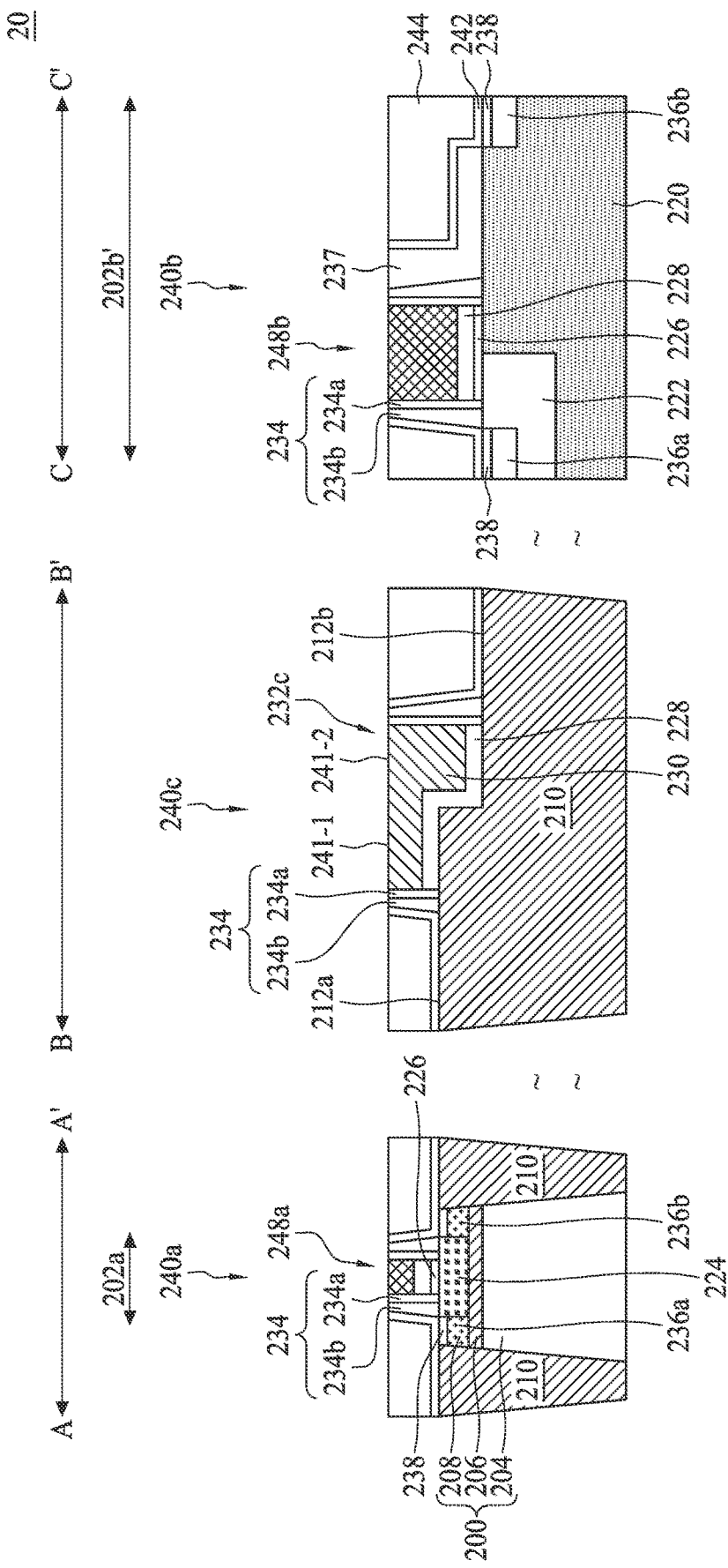

At operation 110, a first metal gate 248a is formed in the first gate trench 246a and a second metal gate 248b is formed in the second gate trench 246b, as shown in FIG. 2L. In some embodiments, the first metal gate 248a and/or the second metal gate 248b can include at least a barrier metal layer, a work functional metal layer and a gap-filling metal layer. The barrier metal layer can include, for example but not limited to, TiN. The work function metal layer can include a single layer of TiN, TaN, TaAlC, TiC, TaC, Co, Al, TiAl, HfTi, TiSi, TaSi or TiAlC, or a multilayer of two or more of these materials, but is not limited thereto. For the n-channel FET, one or more of TaN, TaAlC, TiN, TiC, Co, TiAl, HfTi, TiSi and TaSi is used as the work function metal layer, and for the p-channel FET, one or more of TiAlC, Al, TiAl, TaN, TaAlC, TiN, TiC and Co is used as the work function metal layer. In some embodiments, the gap-filling metal layer can include conductive material such as Al, Cu, AlCu, or W, but is not limited to the above-mentioned materials. In some embodiments, another planarization such as CMP is performed to remove superfluous metal materials and the dielectric layer 245. Accordingly, a top surface of the first metal gate 248a, a top surface of the metal gate 248b, a top surface of the dummy structure 240c and a top surface of the dielectric structure (including the CESL 242 and the ILD 244) are aligned with each other, or at the same level. However, a thickness of the second metal gate 248b is greater than a thickness of the first metal gate 248a. Further, the dummy structure 240c may include a first portion 241-1 and a second portion 241-2 coupled to each other. A thickness of the first portion 241-1 is similar to the thickness of the first metal gate 248a and a thickness of the second portion 241-2 is similar to the thickness of the second metal gate 248b, as shown in FIG. 2L.

Figure 2M:
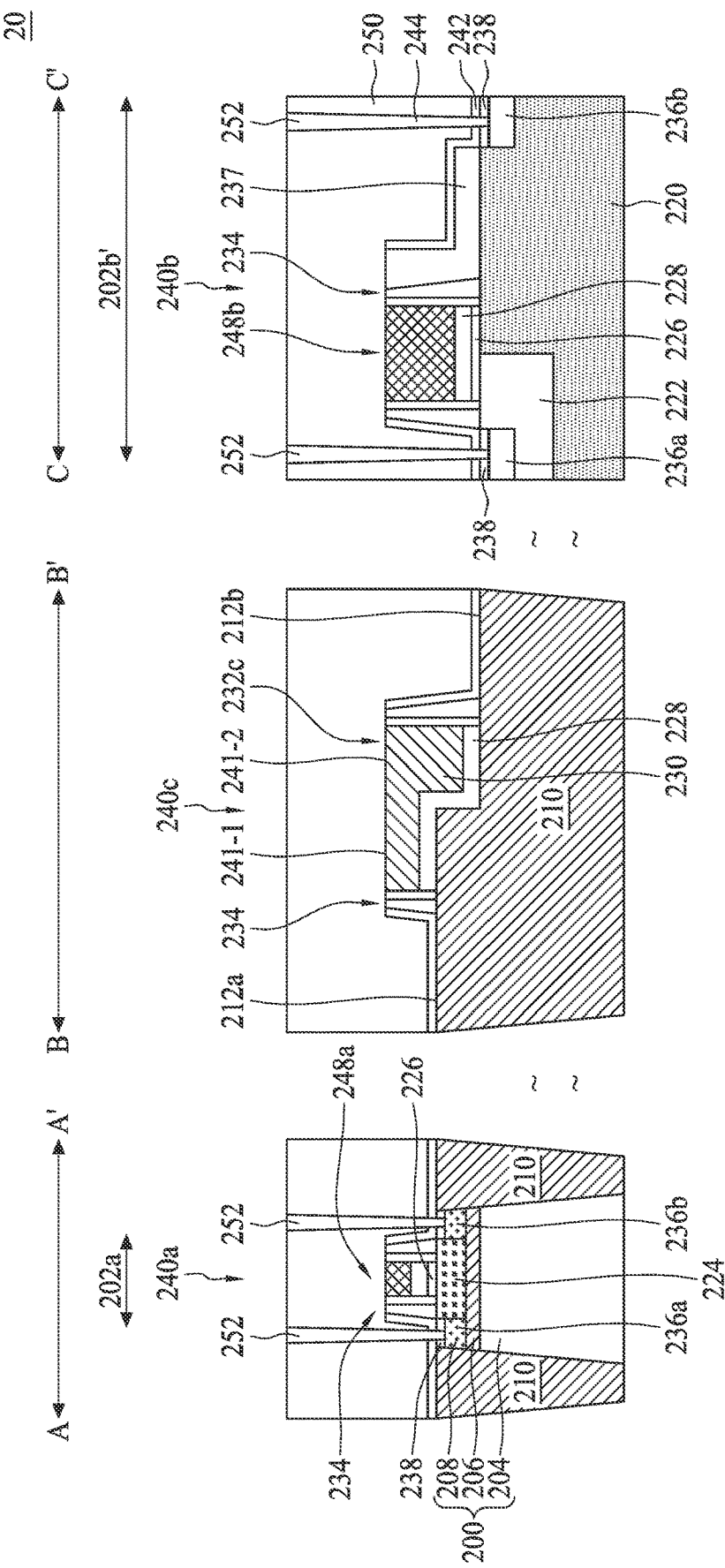

Referring to FIG. 2M, in some embodiments, another ILD 250 may be formed over the substrate 200, and contact structures 252 may be formed in the ILD 250 and the ILD 244. Further, the contact structures 252 may penetrate the ILDs 250 and 244, such that the contact structures 252 are coupled to the doped regions 236a and 236b for providing electrical connection between the first and second devices 240a and 240b and other devices.

Figure 4:
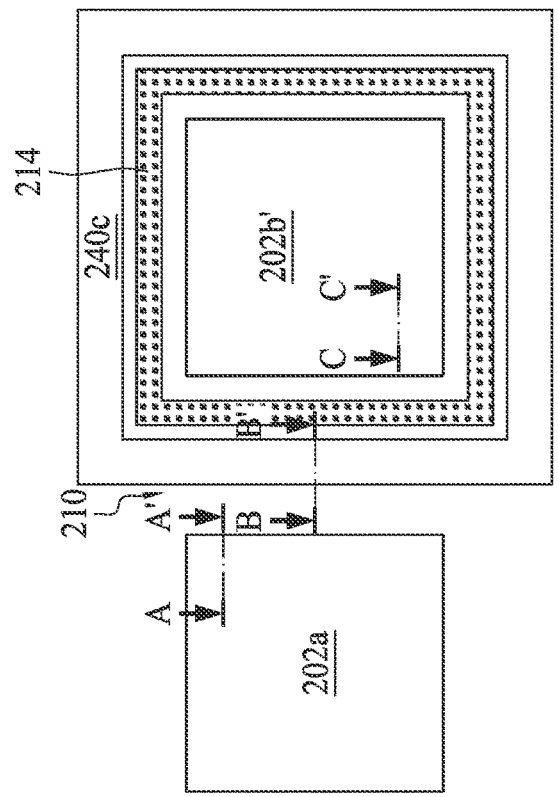
FIG. 4 is a top view illustrating an integrated circuit layout structure according to aspects of the present disclosure.
Figure 3:
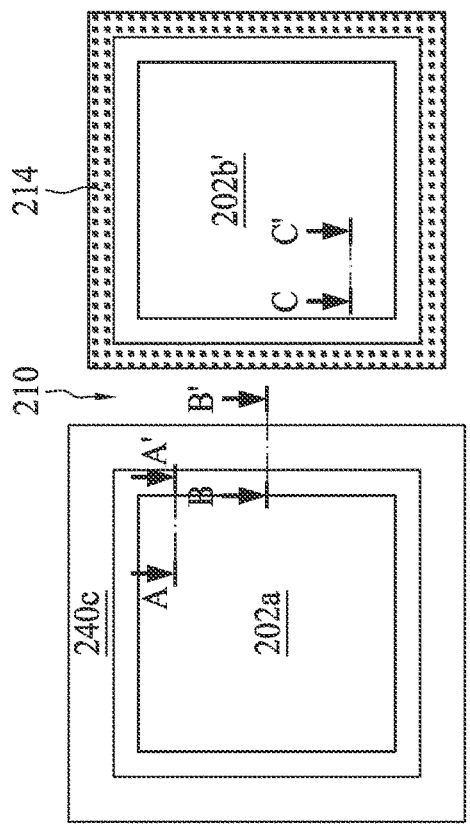
FIG. 3 is a top view illustrating an integrated circuit layout structure according to aspects of the present disclosure.

Accordingly, an integrated circuit 20 is provided. Please refer to FIGS. 3, 4 and 2M, wherein FIGS. 3 and 4 are top views illustrating an integrated circuit layout structure according to aspects of the present disclosure, and FIG. 2M is a cross-sectional view taken along lines A-A', B-B' and C-C' of FIG. 3 and FIG. 4. The integrated circuit 20 includes a substrate 200, where the substrate 200 can be an SOI substrate including a semiconductor bulk 204, a semiconductor layer 208 and a dielectric layer 206 between the semiconductor bulk 204 and the semiconductor layer 208. A first region 202a and a second region 202b' are defined in the substrate 200. In some embodiments, the second region 202b' is a recessed region such that a top surface of the substrate 200 in the second region 202b' is lower than a top surface of the substrate 200 in the first region 202a. In some embodiments, the first region 202a can be used to accommodate LV devices while the second region 202b' can be used to accommodate HV devices, and therefore the first region 202a can be referred to as an LV region and the second region 202b' can be referred to as an HV region.

Further, the substrate 200 includes an isolation structure 210 disposed in the substrate 200 and separating the first region 202a from the second region 202b'. As shown in FIG. 2M, the isolation structure 210 has a first top surface 212a and a second top surface 212b lower than the first top surface 212a. As mentioned above, the first top surface 212a of the isolation structure 210 and the top surface of the substrate 200 in the first region 202a are aligned with each other, or are at the same level, while the second top surface 212b of the isolation structure 210 and the top surface of the substrate 200 in the second region 202b' are aligned with each other, or are at the same level. As shown in FIG. 2B, a step height H is formed at a boundary between the first top surface 212a and the second top surface 212b of the isolation structure 210, and the step height H is also formed between the first region 202a and the second region 202b' of the substrate 200. In some embodiments, the step height H is equal to or greater than the sum of the thickness of the semiconductor layer 208 and the thickness of the dielectric layer 206, but the disclosure is not limited thereto.

The integrated circuit 20 includes a first device 240a in the first region 202a and a second device 240b in the second region 202b'. In some embodiments, the first device 240a can be an LV device while the second device 240b can be an HV device, but the disclosure is not limited thereto. Further, the integrated circuit 20 includes a semiconductor dummy structure 240c disposed on the isolation structure 210. As shown in FIG. 2M, the semiconductor dummy structure 240c covers a portion of the first top surface 212a, a portion of the second top surface 212b, and the boundary between the first top surface 212a and the second top surface 212b. In some embodiments, the semiconductor dummy structure 240c is a frame-like structure. In some embodiments, the frame-like semiconductor dummy structure 240c surrounds the first region 202a, as shown in FIG. 3. In other embodiments, the frame-like semiconductor dummy structure 240c surrounds the second region 202b', as shown in FIG. 4. A portion of the frame-like semiconductor dummy structure 240c is disposed between the first region 202a and the second region 202b', as shown in FIGS. 3, 4 and 2M. A width of the frame-like semiconductor dummy structure 240c is less than a width of a portion of the isolation structure 210 between the first region 202a and the second region 202b', as shown in FIGS. 3 and 4. Further, the width of the frame-like semiconductor dummy structure 240c is greater than a width of the first device 240a and a width of the second device 240b, as shown in FIG. 2M.

Still referring to FIGS. 3 and 4, in some embodiments, the integrated circuit 20 further includes a frame-like doped region 214 disposed in the substrate 100. As shown in FIGS. 3 and 4, the frame-like doped region 214 may surround the second region 202b' and serve as a guard ring for the HV devices in the second region 202b'. In some embodiments, the doped region 214 is separated from the second region 202b' by another isolation structure, though not shown. In some embodiments, the frame-like semiconductor dummy structure 240c is disposed on the isolation structure 210 and surrounds the first region 202a. Further, the frame-like semiconductor dummy structure 240c is offset from the doped region 214, as shown in FIG. 3. In other embodiments, the frame-like semiconductor dummy structure 240c is disposed on the isolation structure 210 but surrounds both of the second region 202b' and the doped region 214. Further, the frame-like semiconductor dummy structure 240c is offset from the doped region 214, as shown in FIG. 4.

Referring back to FIG. 2M, in some embodiments, the first device 240a includes a first metal gate 248a, a high-k gate dielectric layer 228 under the first metal gate 248a, an IL 226 under the high-k gate dielectric layer 228, and doped regions 236a and 236b. The second device 240b includes a second metal gate 248b, a high-k gate dielectric layer 228 under the second metal gate 248b, an IL 226 under the high-k gate dielectric layer 228, and doped regions 236a and 236b. In contrast to the first device 240a and the second device 240b, the semiconductor dummy structure 240c includes a semiconductor layer 230 and a high-k gate dielectric layer 228 under the semiconductor layer 230. The first device 240a further includes a spacer 234 disposed over sidewalls of the first metal gate 248a, the high-k gate dielectric layer 228 and the IL 226. The second device 240b further includes a spacer 234 disposed over sidewalls of the second metal gate 248b, the high-k gate dielectric layer 228 and the IL 226. The semiconductor dummy structure 240c further includes a spacer 234 disposed over sidewalls of the semiconductor layer 230 and the high-k gate dielectric layer 228. Accordingly, the high-k gate dielectric layer 228 of the semiconductor dummy structure 240c is entirely enclosed within the semiconductor layer 230 and the spacer 234, as shown in FIG. 2M.

A thickness of the second device 240b is greater than a thickness of the first device 240a. The semiconductor dummy structure 240c includes a first portion 241-1 and a second portion 241-2 coupled to each other, a thickness of the first portion 241-1 is similar to a thickness of the first device 240a in the first region 202a, and a thickness of the second portion 241-2 is similar to a thickness of the second device 240b in the second region 202b'. Because the thickness of the second device 240b is greater than the thickness of the first device 240a, the thickness of the second portion 241-2 of the semiconductor dummy structure 240c is greater the thickness of the first portion 241-1 of the semiconductor dummy structure 240c. Accordingly, top surfaces of the first device 240a, the semiconductor dummy structure 240c and the second device 240b are aligned with each other, or at a same level.

In some embodiments, a width of the second device 240b is greater than a width of the first device 240a, and a width of the semiconductor dummy structure 240c is greater than the widths of both the first device 240a and the second device 240b. In some embodiments, the width of the semiconductor dummy structure 240c is greater than 2 times a minimum critical dimension (CD) of the integrated circuit. As mentioned above, the critical dimension (or the design rule limitation) defines the minimum width of a line or the minimum space between two lines permitted in the fabrication of devices. As mentioned above, if the width of the semiconductor dummy structure 240c (i.e., the semiconductor layer 230) is less than 2 times the minimum critical dimension of the integrated circuit 20, the high-k material may be left over the boundary between the first top surface 212a and the second top surface 212b when the semiconductor dummy structure 240c is formed offset from the boundary due to process variation such as misalignment. Thus, the unwanted high-k residue issue occurs.

Figure 5:
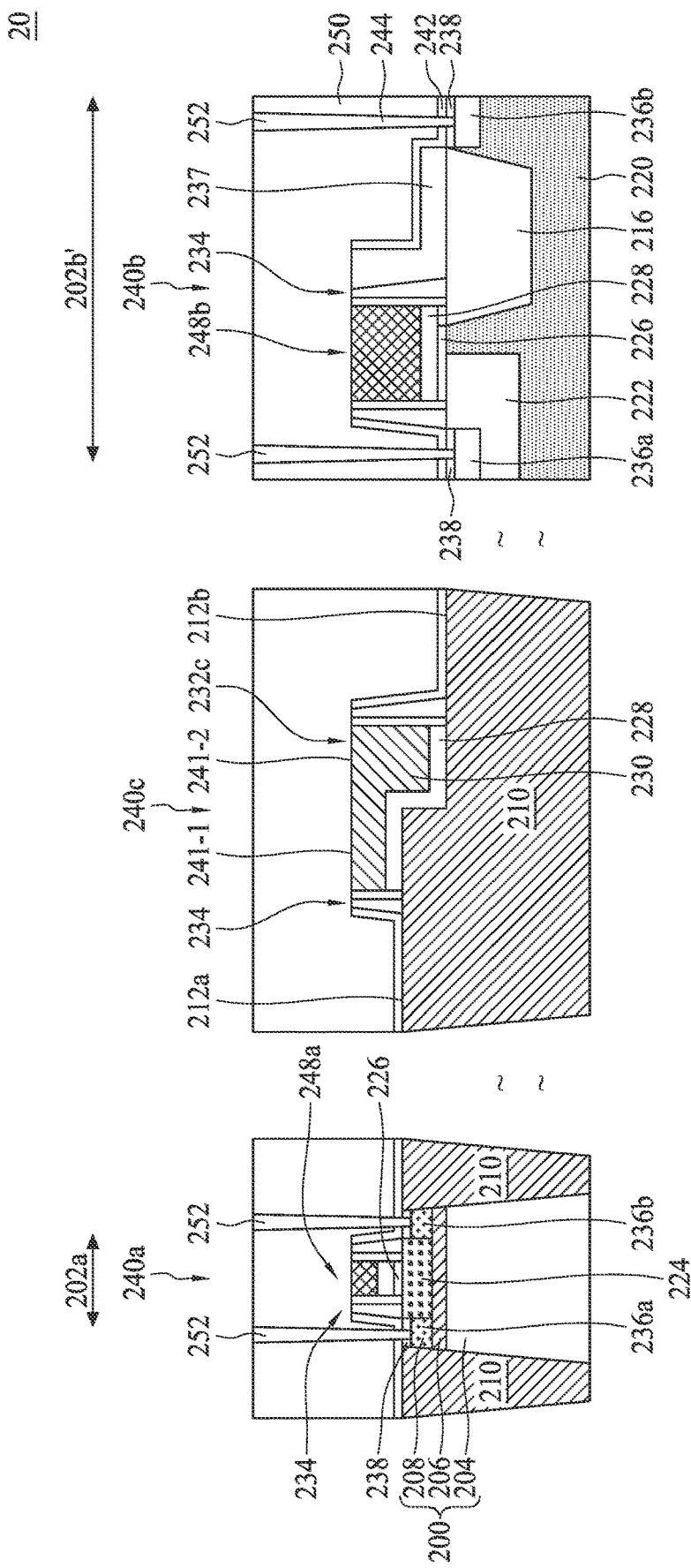
FIG. 5 is a cross-sectional view illustrating an integrated circuit according to aspects of the present disclosure.

Please refer to FIG. 5, which is a cross-sectional view illustrating an integrated circuit according to aspects of the present disclosure. It should be noted that same elements in FIGS. 2M and 5 are indicated by the same numerals, and details of the same elements shown in FIGS. 2M and 5 are omitted in the description of FIG. 5 for brevity. In some embodiments, the integrated circuit 20 includes another isolation structure 216 disposed in the second region 202b'. The isolation structure 216 can be an STI or a field oxide (FOX). As shown in FIG. 5, a portion of the second metal gate 248b and a portion of the high-k gate dielectric layer 228 cover a portion of the isolation structure 216.

The present disclosure therefore provides a boundary scheme for the integration of HV SOI devices and LV SOI devices with HKMG technology. In some embodiments, the present disclosure therefore provides a boundary scheme for the integration of HV SOI devices and LV SOI devices with high-k first and gate-last technology. In some embodiments, a dummy structure such as the semiconductor dummy structure is disposed on the boundary between the regions for accommodating the HV and LV devices. The semiconductor dummy structure is provided to entirely seal the high-k dielectric material that may be generated during the manufacturing operations, and thus the high-k residue contamination can be mitigated. Further, the method for forming the semiconductor dummy structure is compatible with and can be easily integrated in the manufacturing operations for SOI technology, HKMG technology and HV-LV integration.

According to one embodiment of the present disclosure, a method for forming an integrated circuit is provided. The method includes following operations. A substrate is received. The substrate includes a first region, a second region and an isolation structure separating the first region from the second region. The isolation structure has a first top surface, a second top surface lower than the first top surface, and a boundary between the first top surface and the second top surface. A first device is formed in the first region, a second device is formed in the second region, and a dummy structure is formed on a portion of the first top surface, a top of the second top surface and the boundary between the first top surface and the second top surface. A dielectric structure is formed over the substrate. A top surface of the dielectric structure, a top surface of the first device, a top surface of the second device and a top surface of the dummy structure are aligned with each other. A first metal gate is formed in the first device, and a second metal gate is formed in the second device.

According to one embodiment of the present disclosure, a method for forming an integrated circuit is provided. The method includes following operations. A substrate is received. The substrate includes a first region, a second region and an isolation structure separating the first region from the second region. The isolation structure has a first top surface, a second top surface lower than the first top surface, and a boundary between the first top surface and the second top surface. A first sacrificial gate is formed in the first region, a second sacrificial gate is formed in the second region, and a dummy structure is formed on a portion of the first top surface, a portion of the second top surface and the boundary between the first top surface and the second top surface. A first dielectric structure is formed over the substrate. A dielectric layer is formed over the dummy structure.

The first sacrificial gate and the second sacrificial gate are exposed through the dielectric layer. The first sacrificial gate is replaced with a first metal gate, and the second sacrificial gate is replaced with a second metal gate. A second dielectric structure is formed over the first metal gate, the second metal gate, the dummy structure and the first dielectric structure.

According to one embodiment of the present disclosure, a method for forming an integrated circuit is provided. The method includes following operations. A substrate is received. The substrate includes a first region, a second region and an isolation structure separating the first region from the second region. A portion of the substrate and a portion of the isolation structure are recessed such that the isolation structure obtains a first top surface, a second top surface lower than the first top surface, and a boundary between the first top surface and the second top surface. A first sacrificial gate is formed in the first region, a second sacrificial gate is formed in the second region, and a dummy structure is formed on a portion of the first top surface, a portion of the second top surface and the boundary between the first top surface and the second top surface. A first dielectric structure is formed over the substrate. The first sacrificial gate is replaced with a first metal gate, and the second sacrificial gate is replaced with a second metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit, comprising:
    receiving a substrate having a first region, a second region and an isolation structure separating the first region from the second region, wherein the isolation structure has a first top surface, a second top surface lower than the first top surface, and a boundary between the first top surface and the second top surface;
    forming a first device in the first region, a second device in the second region and a dummy structure on a portion of the first top surface, a portion of the second top surface, and the boundary between the first top surface and the second top surface;
    forming a dielectric structure over the substrate, wherein a top surface of the dielectric structure, a top surface of the first device, a top surface of the second device, and a top surface of the dummy structure are aligned with each other; and
    forming a first metal gate in the first device and a second metal gate in the second device.

2. The method of claim 1, wherein a top surface of the first region is aligned with the first top surface of the isolation structure, and a top surface of the second region is aligned with the second top surface of the isolation structure.

3. The method of claim 1, wherein the forming of the first device, the second device and the dummy structure further comprises:
    forming a gate dielectric layer over the substrate;
    forming a semiconductor layer on the gate dielectric layer; and
    patterning the gate dielectric layer and the semiconductor layer to form a first sacrificial gate in the first region, a second sacrificial gate in the second region, and the dummy structure on the isolation structure,
    wherein the dummy structure covers the portion of the first top surface, the portion of the second top surface, and the boundary between the first top surface and the second top surface.

4. The method of claim 3, wherein thicknesses of the first sacrificial gate, the second sacrificial gate and the dummy structure are similar.

5. The method of claim 3, wherein the forming of the first metal gate in the first device and the second metal gate in the second device further comprises:
    removing the first sacrificial gate from the first device to form a first gate trench and the second sacrificial gate from the second device to form a second gate trench; and
    forming the first metal gate in the first gate trench and the second metal gate in the second gate trench,
    wherein a thickness of the second metal gate is greater than a thickness of the first metal gate.

6. The method of claim 5, further comprising forming a dielectric layer over the dummy structure prior to the removing of the first sacrificial gate and the second sacrificial gate, wherein the first device and the second device are exposed through the dielectric layer.

7. The method of claim 1, wherein the forming of the dielectric structure over the substrate further comprising:
    forming the dielectric structure to cover the first device, the second device and the dummy structure; and
    removing a portion of the dielectric structure, a portion of the first device, a portion of the second device and a portion of the dummy structure such that the top surface of the first device, the top surface of the second device, and the top surface of the dummy structure are aligned with each other.

8. The method of claim 1, wherein the dummy structure comprises a first portion and a second portion coupled to each other, a thickness of the first portion is similar to the thickness of the first metal gate, and a thickness of the second portion is similar to the thickness of the second metal gate.

9. A method for forming an integrated circuit, comprising:
    receiving a substrate having a first region, a second region and an isolation structure separating the first region from the second region, wherein the isolation structure has a first top surface, a second top surface lower than the first top surface, and a boundary between the first top surface and the second top surface;
    forming a first sacrificial gate of a first device in the first region, a second sacrificial gate of a second device in the second region and a dummy structure on a portion of the first top surface, a portion of the second top surface, and the boundary between the first top surface and the second top surface;
    forming a first dielectric structure over the substrate, wherein a top surface of the first dielectric structure, a top surface of the first sacrificial gate of first device, a top surface of the second sacrificial gate of the second device, and a top surface of the dummy structure are aligned with each other;
    forming a dielectric layer over the dummy structure, wherein the first sacrificial gate and the second sacrificial gate are exposed through the dielectric layer;

replacing the first sacrificial gate with a first metal gate and the second sacrificial gate with a second metal gate; and forming a second dielectric structure over the first metal gate, the second metal gate, the dummy structure and the first dielectric structure.

10. The method of claim 9, wherein the forming of the first sacrificial gate, the second sacrificial gate and the dummy structure further comprises:

forming a sacrificial dielectric layer over the substrate;

forming a sacrificial semiconductor layer on the sacrificial dielectric layer; and patterning the sacrificial dielectric layer and the sacrificial semiconductor layer to form the first sacrificial gate in the first region, the second sacrificial gate in the second region, and the dummy structure on the isolation structure.

11. The method of claim 9, wherein the forming of the first dielectric structure over the substrate further comprises:

forming the first dielectric structure to cover the first sacrificial gate, the second sacrificial gate and the dummy structure; and removing a portion of the first dielectric structure to expose the first sacrificial gate and the second sacrificial gate such that the top surface of the first dielectric structure, the top surface of the first sacrificial gate, the top surface of the second sacrificial gate, and the top surface of the dummy structure are aligned with each other.

12. The method of claim 9, wherein a top surface of the first metal gate, a top surface of the second metal gate, the top surface of the dummy structure, and the top surface of the first dielectric structure are aligned with each other.

13. The method of claim 9, wherein the dummy structure comprises a first portion and a second portion coupled to each other, a thickness of the first portion is similar to a thickness of the first metal gate, and a thickness of the second portion is similar to a thickness of the second metal gate.

14. The method of claim 9, further comprising forming contact structures in the second dielectric structure.

15. A method for forming an integrated circuit, comprising:

receiving a substrate having a first region, a second region and an isolation structure separating the first region from the second region;

recessing a portion of the substrate and a portion of the isolation structure such that the isolation structure obtains a first top surface, a second top surface lower than the first top surface, and a boundary between the first top surface and the second top surface;

forming a first sacrificial gate of a first device in the first region, a second sacrificial gate of a second device in the second region and a dummy structure on a portion of the first top surface, a portion of the second top surface and the boundary between the first top surface and the second top surface;

forming a first dielectric structure over the substrate, wherein a top surface of the first dielectric structure, a top surface of the first sacrificial gate of first device, a top surface of the second sacrificial gate of the second device, and a top surface of the dummy structure are aligned with each other; and replacing the first sacrificial gate with a first metal gate and replacing the second sacrificial gate with a second metal gate.

16. The method of claim 15, wherein a top surface of the first region is aligned with the first top surface of the isolation structure, and a top surface of the second region is aligned with the second top surface of the isolation structure.

17. The method of claim 15, wherein a thickness of the first sacrificial gate, a thickness of the second sacrificial gate and a thickness of the dummy structure are similar.

18. The method of claim 15, wherein a thickness of the second metal gate is greater than a thickness of the first metal gate.

19. The method of claim 18, wherein the dummy structure comprises a first portion and a second portion coupled to each other, a thickness of the first portion is similar to the thickness of the first metal gate, and a thickness of the second portion is similar to the thickness of the second metal gate.

20. The method of claim 15, further comprising:

forming a second dielectric structure over the first metal gate, the second metal gate, the dummy structure and the first dielectric structure; and forming contact structures in the second dielectric structure.

* * * * *